(12) United States Patent
Ramakrishnan et al.

(10) Patent No.: US 10,541,703 B2
(45) Date of Patent: Jan. 21, 2020

(54) INTERLEAVED ADC WITH ESTIMATION OF DSA-SETTING-BASED IL MISMATCH

(71) Applicant: TEXAS INSTRUMENTS INCORPORATED, Dallas, TX (US)

(72) Inventors: Sthanunathan Ramakrishnan, Karnataka (IN); Sashidharan Venkatraman, Karnataka (IN); Jaiganesh Balakrishnan, Karnataka (IN); Sreenath Narayanan Potty, Karnataka (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/029,539

(22) Filed: Jul. 6, 2018

(65) Prior Publication Data

US 2019/0013818 A1 Jan. 10, 2019

(30) Foreign Application Priority Data

Jul. 6, 2017 (IN) .............................. 201741023743

(51) Int. Cl.
*H03M 1/12* (2006.01)
*H03F 1/02* (2006.01)
*H03M 1/06* (2006.01)

(52) U.S. Cl.
CPC .......... *H03M 1/121* (2013.01); *H03F 1/0244* (2013.01); *H03M 1/0626* (2013.01); *H03M 1/129* (2013.01)

(58) Field of Classification Search
CPC .... H03M 1/121; H03M 1/0626; H03M 1/129; H03F 1/0244
See application file for complete search history.

(56) References Cited

U.S. PATENT DOCUMENTS

| 7,782,235 B1* | 8/2010 | Velazquez | H03M 1/1052 341/118 |
| 9,543,976 B2* | 1/2017 | Miki | H03M 1/1215 |
| 9,608,661 B2* | 3/2017 | Talty | H04L 1/0071 |

* cited by examiner

Primary Examiner — Kabir A Timory
(74) Attorney, Agent, or Firm — John R. Pessetto; Charles A. Brill; Frank D. Cimino

(57) ABSTRACT

An interleaved ADC receives an RX signal attenuated by a DSA based on an active DSA setting, within a range of DSA settings (DSA setting range) corresponding to selectable attenuation steps, the DSA setting range partitioned into a number of DSA setting subranges (DSA subranges). The ADC includes an IL mismatch estimation engine in the digital signal path, with an estimation subrange blanker, and an IL mismatch estimator. The estimation subrange blanker is coupled to receive the IADC data stream, and responsive to a DSA subrange allocation signal to select, in each of successive aggregation cycles, IADC data corresponding to an active DSA setting that is within an allocated DSA subrange (DSA active data within an DSA allocated subrange). The IL mismatch estimator aggregates, during each aggregation cycle, IL mismatch estimation data based on the selected DSA active data within the DSA allocated subrange, generates an estimate of IL mismatch (IL mismatch estimate) based on the aggregated IL mismatch estimation data, generates IL mismatch correction parameters based on the aggregated IL mismatch estimation data, and generates IL mismatch estimate uncertainty data corresponding to an uncertainty in the IL mismatch estimate used to generate the associated IL mismatch correction parameters for the DSA allocated subrange. A DSA statistics collector to collect a distribution of DSA settings over a pre-defined time period (DSA setting distribution statistics). An estimation subrange allocator coupled to receive DSA setting distribution statistics, and the IL mismatch estimate uncertainty data, and to provide to the estimation subrange blanker the DSA subrange allocation signal according to a pre-defined allocation strategy.

26 Claims, 7 Drawing Sheets

INTERLEAVED ADC WITH ESTIMATION OF DSA-SETTING-BASED IL MISMATCH

CROSS-REFERENCE TO RELATED APPLICATIONS

Priority is claimed under 37 CFR 1.78 and 35 USC 119(e) to IN Provisional Application 201741023743, filed 2017 Jul. 6, which is incorporated by reference in its entirety.

BACKGROUND

Data communication systems, over wired or wireless communications links, can be architected with RX based on an interleaved ADC (IADC), to increase the effective sampling rate for the input RX signal (for example, an effective IADC sample rate of gigasamples per second). An example application is RF wireless communication, with a receiver/transceiver architected with an RX RF-IADC.

An IADC includes multiple component ADCs, each sampling the input signal at a fraction of the overall IADC sample rate, with the sampling points of the component ADCs shifted so that the interleaved/multiplexed output from the component ADCs is equivalent to sampling the input at the IADC sample rate.

Digital step attenuation (DSA) in the IADC receiver chain provides automatic gain control, dynamically attenuating/adjusting RX signal power to the input range of the ADCs. Automatic gain control dynamically selects DSA attenuation steps, each step to provide a specified level of attenuation (in dB).

In a receiver/transceiver, an RX IADC can have interleaving mismatches due to mismatches in the gain/delay/bandwidth of the component ADCs. IL mismatch spurs/images (unwanted frequency components) can degrade SFDR (Spurious Free Dynamic Range), which degrades SNR (Signal to Noise Ration), SINAD (Signal to Noise and Distortion), and ENOB (Effective Number of Bits). The digital step attenuation introduced by the DSA in the RX signal chain can result in IL mismatches in the interleaved/multiplexed IADC output that depend on the active DSA attenuation setting. This DSA IL mismatch can cause spurs/images in the IADC output that are a function of the active DSA setting.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes an interleaved ADC with estimation of DSA-setting-based IL mismatch within DSA setting subranges, including an IL mismatch estimation engine with selective estimation allocation/blanking to select IADC data for observed DSA setting(s) within allocated DSA setting subrange(s), and with aggregation of corresponding IL mismatch data to provide IL mismatch estimates and associated IL mismatch correction parameters.

According to aspects of the Disclosure, an interleaved ADC receives an RX signal attenuated by a DSA based on an active DSA setting, within a range of DSA settings (DSA setting range) corresponding to selectable attenuation steps, the DSA setting range partitioned into a number of DSA setting subranges (DSA subranges). The ADC includes an IL mismatch estimation engine in the digital signal path, with an estimation subrange blanker, and an IL mismatch estimator. The estimation subrange blanker is coupled to receive the IADC data stream, and responsive to a DSA subrange allocation signal to select, in each of successive aggregation cycles, IADC data corresponding to an active DSA setting that is within an allocated DSA subrange (DSA active data within an DSA allocated subrange). The IL mismatch estimator aggregates, during each aggregation cycle, IL mismatch estimation data based on the selected DSA active data within the DSA allocated subrange, generates an estimate of IL mismatch (IL mismatch estimate) based on the aggregated IL mismatch estimation data, generates IL mismatch correction parameters based on the aggregated IL mismatch estimation data, and generates IL mismatch estimate uncertainty data corresponding to an uncertainty in the IL mismatch estimate used to generate the associated IL mismatch correction parameters for the DSA allocated subrange. A DSA statistics collector to collect a distribution of DSA settings over a pre-defined time period (DSA setting distribution statistics). An estimation subrange allocator coupled to receive DSA setting distribution statistics, and the IL mismatch estimate uncertainty data, and to provide to the estimation subrange blanker the DSA subrange allocation signal according to a pre-defined allocation strategy.

Other aspects and features of the invention claimed in this Patent Document will be apparent to those skilled in the art from the following Disclosure.

BRIEF DESCRIPTION OF THE DRAWINGS

FIG. 2A illustrates DSA-based IL mismatch images for an RX signal with carrier frequency fc; and FIG. 2B illustrates residual IL image versus DSA-setting (for comparison with an example design goal of −75dBFS SFDR across all DSA settings).

FIG. 3 illustrates an example dual-channel (RX-A/RX-B) IL mismatch estimation engine 100, including dual-channel IL estimation subrange blankers 110A/110B providing selective input of IADC data E0/E1 to an IL mismatch estimator 130, with the estimation subrange blankers E0/E1 controlled by an IL estimation subrange allocator 150 to select active_DSA_data within an allocated DSA subrange, with DSA_subrange_allocation according to a pre-defined allocation strategy for observed/active DSA setting(s) within observed/allocated DSA setting subrange(s), the IL mismatch estimator aggregating IL mismatch data based on the selectively allocated active_DSA_data (E0/E1), and generating associated IL mismatch estimates and associated IL mismatch correction parameters 135;

FIG. 4 illustrates an alternate example dual-channel (RX-A/RX-B) IL mismatch estimation engine 200, as in FIG. 3, and configured with an IL mismatch data aggregator 230, and DSA subrange allocation memory 235, in which, for successive DSA_subrange_allocations, the IL mismatch data aggregator aggregates IL mismatch estimation data, based on the selected active_DSA_data (E0/E1), into dynamically allocable and configurable DSA subrange memory banks in the DSA subrange allocation memory, for retrieval by an IL mismatch parameter estimator 232 to generate IL mismatch estimates and corresponding IL mismatch correction parameters 232/235; and FIG. 5 illustrates an alternate example dual-channel (RX-A/RX-B) IL mismatch estimation engine 300, as in FIG. 4, and with an IL estimation subrange allocator 350 including an estimation allocator 351 and DSA subrange allocation controller 353, with the estimation allocator 351 providing a DSA_subrange_allocation_cmd (command), based on a pre-defined subrange allocation strategy, and a DSA_subrange_PoorEstim_list, to the DSA subrange allocation controller, which also receives the active_DSA_setting, and which in response issues a DSA_subrange_allocation signal to the estimation subrange blankers 110A/110B, including overriding a DSA_subrange_allocation from the estimation allocator (DSA_subrange_allocation_cmd) to force allocation of DSA subranges that have not been updated frequently enough to provide a pre-defined IL mismatch estimate uncertainty.

FIG. 7A illustrates an example digital corrector 360 configured to correct IL gain mismatch dependent on the active DSA setting, using a compensation filter 361 with coefficients based on corresponding IL mismatch gain correction parameters; and FIG. 7B illustrates an example analog corrector configured to correct IL timing mismatch dependent on the active DSA setting, based on estimated IL mismatch timing correction parameters.

DETAILED DESCRIPTION

This Description and the Drawings constitute a Disclosure for an interleaved ADC with estimation of DSA-setting-based IL mismatch within DSA setting subranges, including an IL mismatch estimation engine with selective estimation allocation/blanking to select IADC data for observed DSA setting(s) within allocated DSA setting subrange(s), and with aggregation of corresponding IL mismatch data to provide IL mismatch estimates and associated IL mismatch correction parameters, including describing design examples (example implementations), and illustrating various technical features and advantages.

In brief overview, an interleaved ADC receives an RX signal attenuated by a DSA based on an active DSA setting, within a range of DSA settings (DSA setting range) corresponding to selectable attenuation steps, the DSA setting range partitioned into a number of DSA setting subranges (DSA subranges). The ADC includes an IL mismatch estimation engine in the digital signal path, with an estimation subrange blanker, and an IL mismatch estimator. The estimation subrange blanker is coupled to receive the IADC data stream, and responsive to a DSA subrange allocation signal to select, in each of successive aggregation cycles, IADC data corresponding to an active DSA setting that is within an allocated DSA subrange (DSA active data within an DSA allocated subrange). The IL mismatch estimator aggregates, during each aggregation cycle, IL mismatch estimation data based on the selected DSA active data within the DSA allocated subrange, generates an estimate of IL mismatch (IL mismatch estimate) based on the aggregated IL mismatch estimation data, generates IL mismatch correction parameters based on the aggregated IL mismatch estimation data, and generates IL mismatch estimate uncertainty data corresponding to an uncertainty in the IL mismatch estimate used to generate the associated IL mismatch correction parameters for the DSA allocated subrange. A DSA statistics collector to collect a distribution of DSA settings over a pre-defined time period (DSA setting distribution statistics). An estimation subrange allocator coupled to receive DSA setting distribution statistics, and the IL mismatch estimate uncertainty data, and to provide to the estimation subrange blanker the DSA subrange allocation signal according to a pre-defined allocation strategy.

Figure 1:
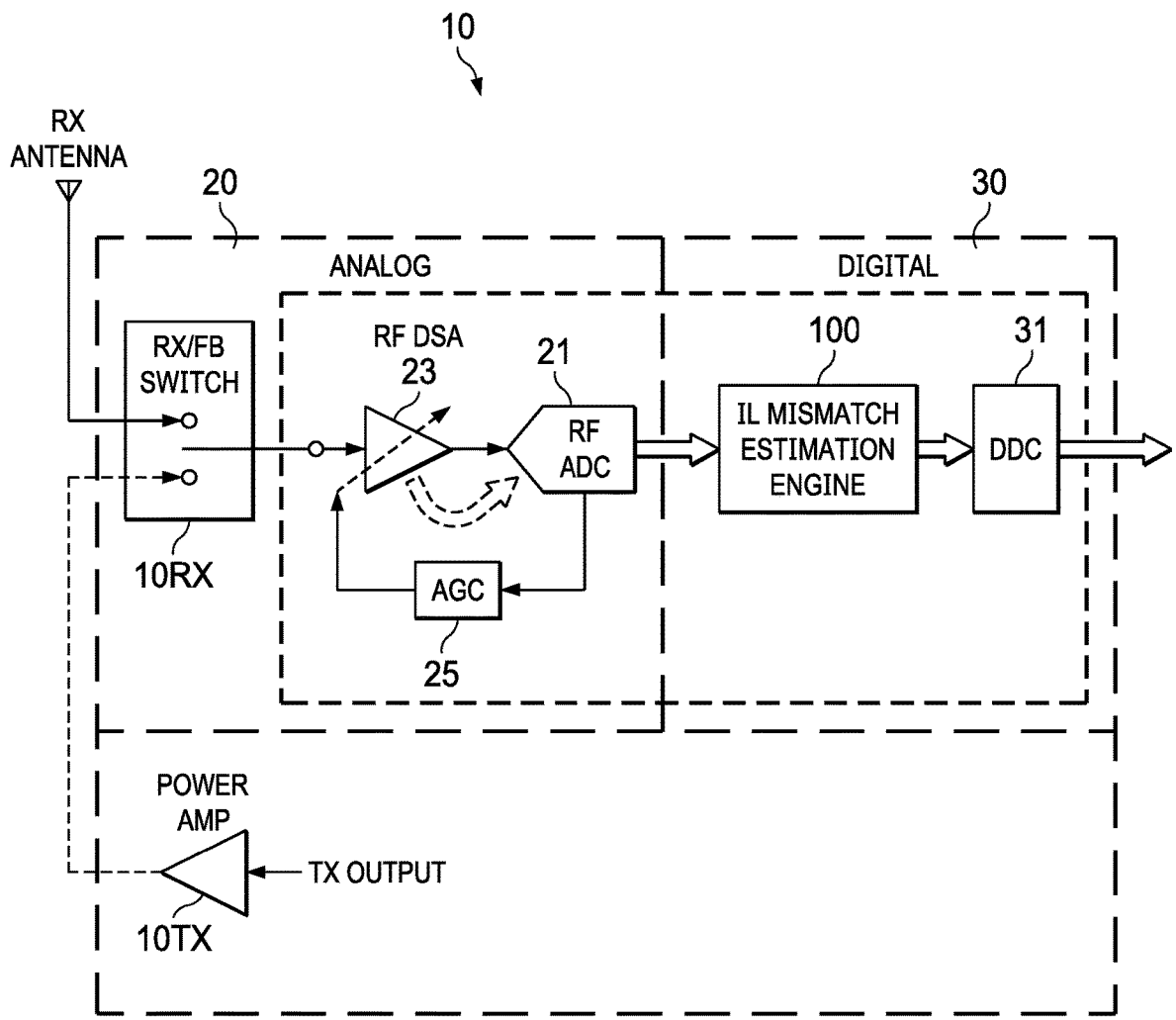
FIG. 1 illustrates an example RF TX/RX (transceiver) 10 including RX 10RX and TX 10TX, the RX including analog and digital signal paths 20/30 and an interleaved ADC 21, with a DSA 23 to provide step attenuation of the RX signal for the input range of the component ADCs, and including in the digital signal path an IL mismatch estimation engine 100, configured to provide IL mismatch estimation for DSA-setting-based IL mismatch according to the Disclosure.

FIG. 1 illustrates an example RF TX/RX (transceiver) 10 including RX 10RX and TX 10TX. The TX chain 10TX includes a power amplifier 15. The RX chain includes analog and digital signal paths 20/30, with an interleaved ADC 21. The example IADC is implemented as an RF IADC.

In the analog signal chain, a DSA 23 provides step attenuation of the input RX signal for the input range of the IADC component ADCs. The DSA step attenuation setting is controlled by AGC 25 based on IADC power output. The IADC outputs interleaved/multiplexed digital samples as IADC output data, with digital down conversion (DDC) 31.

An IL mismatch estimation engine 100 is included in the digital signal chain. The IL mismatch estimation engine 100 is configured to provide IL mismatch estimation for DSA-setting-based IL mismatch according to the Disclosure.

Figure 2A:
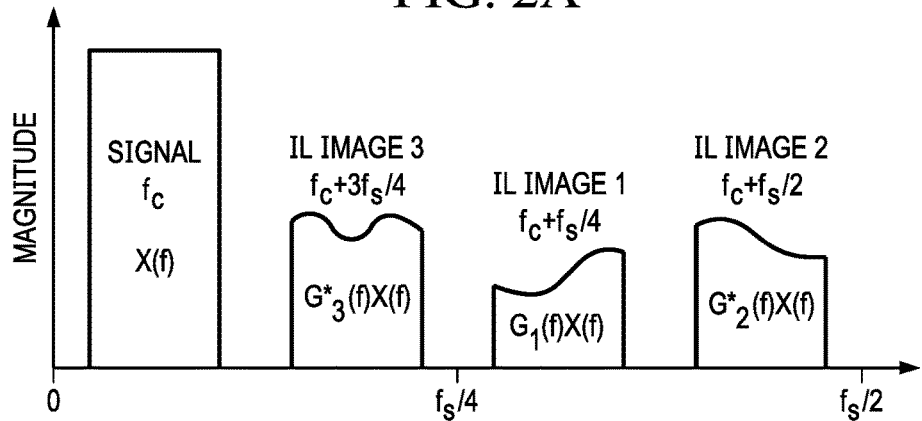
FIGS. 2A and 2B provide example waveforms illustrating DSA-based IL mismatch.
Figure 2B:
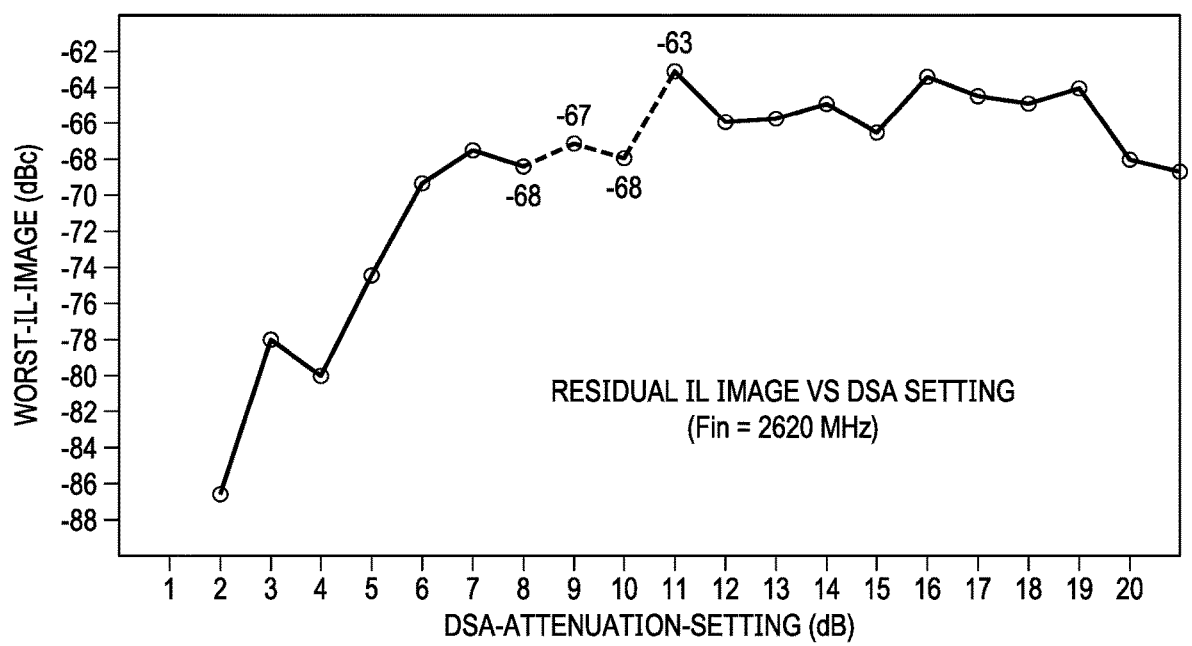

FIGS. 2A and 2B provide example waveforms illustrating DSA-based IL mismatch. FIG. 2A illustrates DSA-based IL mismatch images for an RX signal with carrier frequency fc: Image 1 at fc+fs/4; Image 2 at fc+fs/2; and Image 3 at fc+3fs/4. FIG. 2B illustrates residual IL image versus DSA-setting. For comparison, an example design goal is −75 dBFS SFDR across all DSA settings.

Figure 3:
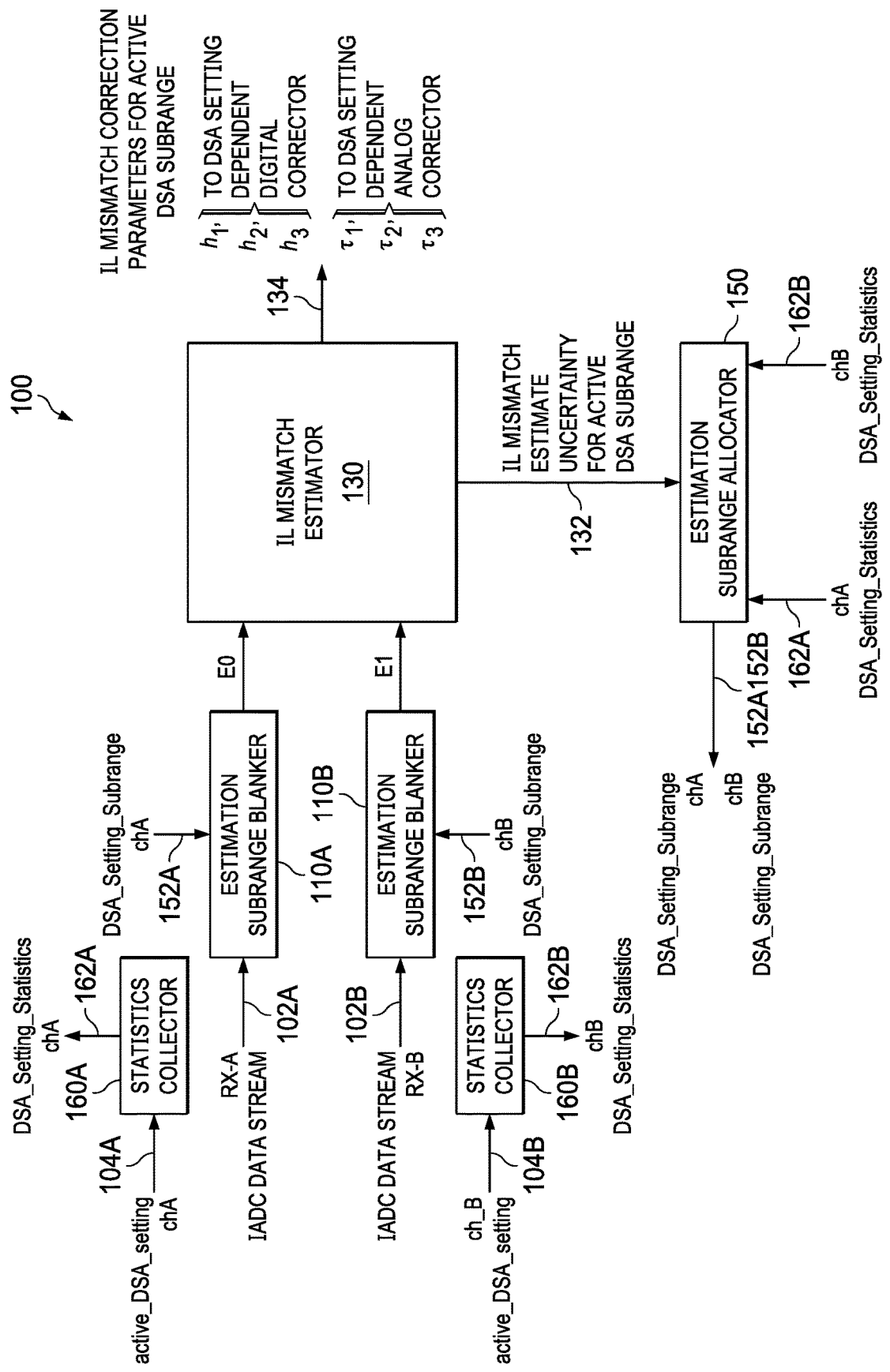
FIGS. 3, 4, 5 illustrate, for an example interleaved ADC, example architectures for estimating DSA-setting-based IL mismatch, based on selective allocation/blanking for observed/active DSA settings (active_DSA_data) within observed/allocated DSA setting subranges (DSA_subrange_allocation), according to the Disclosure.
Figure 4:
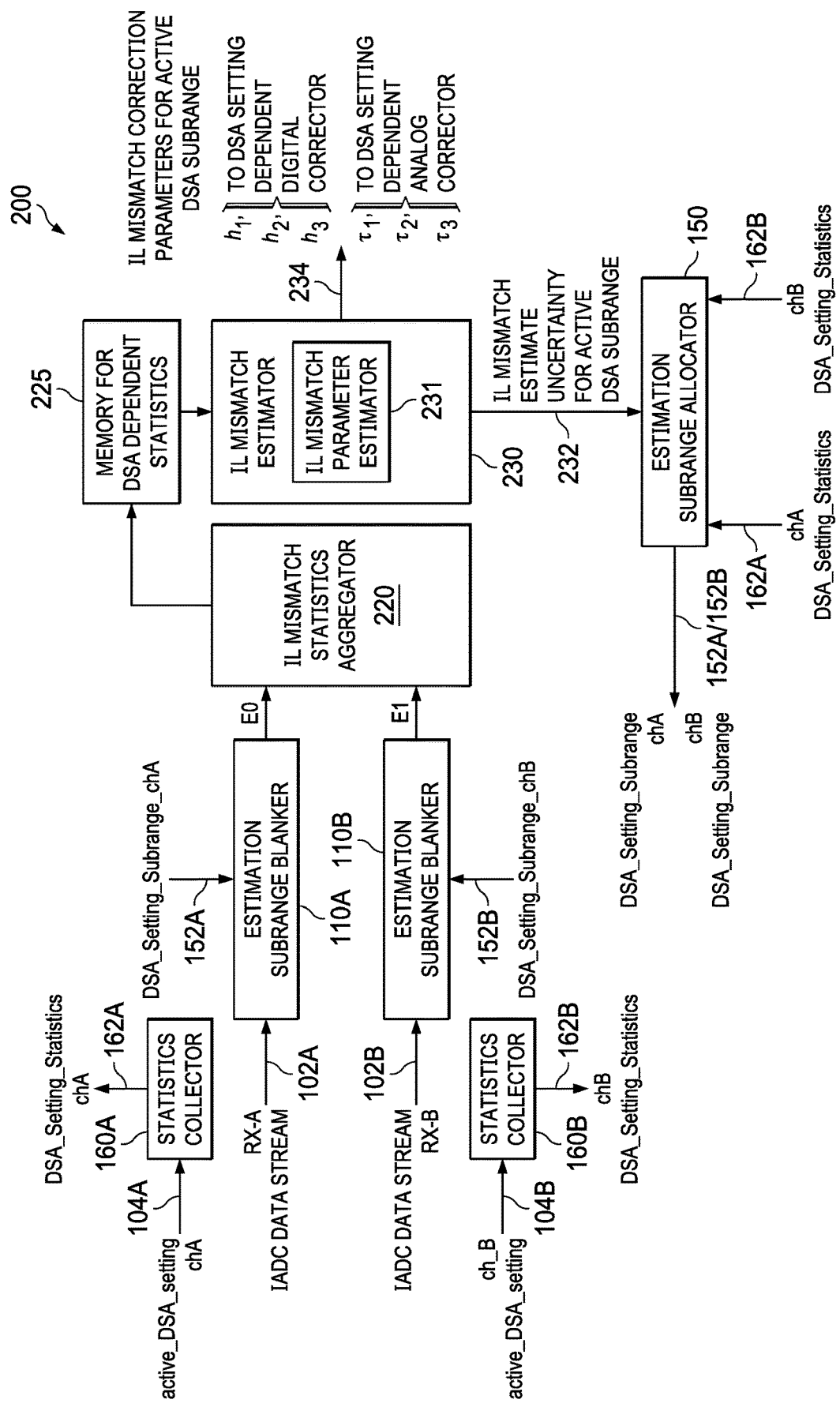
Figure 5:
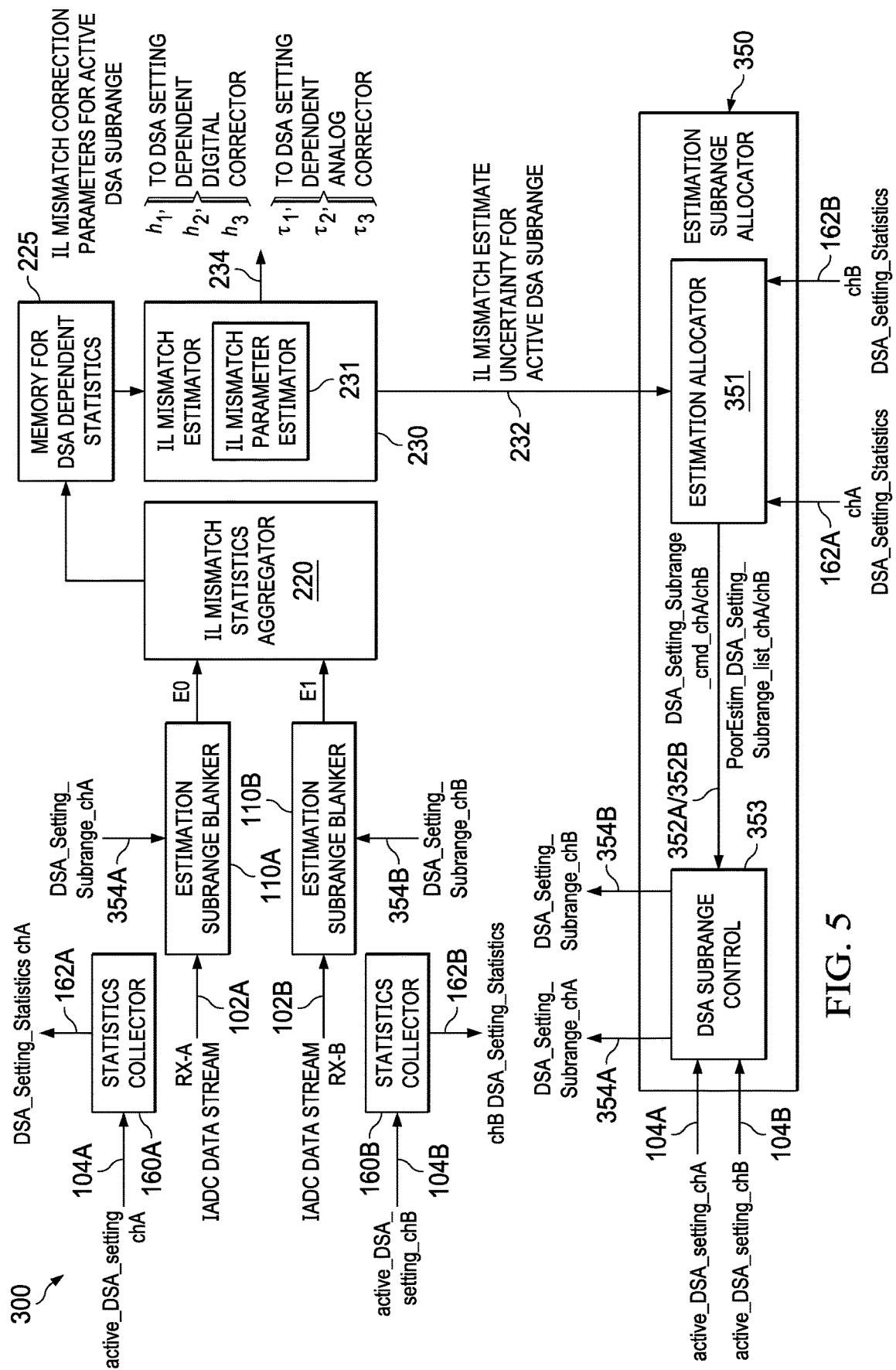

FIGS. 3-5 illustrate, for an example dual-channel interleaved ADC, example IL mismatch estimation architectures for estimating DSA-setting-based IL mismatch, with selective allocation/blanking for observed/active DSA settings (active_DSA_data) within observed/allocated DSA setting subranges (DSA_subrange_allocations), according to the Disclosure.

The example IL mismatch estimation engines in FIGS. 3-5 are configured for an example dual-channel interleaved ADC, although the Disclosure has general applicability to single-channel, and other multi-channel, implementations. For these dual-channel examples, the IL mismatch estimation engines include dual-channel signal and commands designated in the FIGS as chA/chB, but to avoid unnecessarily complex nomenclature, the designations chA/chB are not used in the Description.

As illustrated in FIGS. 3-5, the example IL mismatch estimation engines are effectively dedicated channel RX-A and RX-B engines E0 and E1 with separate RX-A and RX-B signal chains providing respectively E0 and E1 inputs to an IL mismatch estimator. Each example dual-channel IL mismatch estimation engine is actually implemented as configurable dual IL mismatch estimation engines E0/E1 configurably allocated to the RX-A and RX-B signal paths. Operation of the dual configurable IL mismatch estimation engines E0/E1 is described further in connection with FIG. 6.

FIG. 3 illustrates an example dual-channel (RX-A/RX-B) IL mismatch estimation engine 100, including IL estimation subrange blankers 110A/110B providing separate signal path input E0/E1 to an IL mismatch estimator 130. As illustrated, the estimation subrange blankers 110A/110B receive RX-A and RX-B IADC data streams, although for the example dual-channel IL mismatch estimation engine, the estimation subrange blankers 110A/110B are configurable for input from either RX-A or RX-B, providing configurable signal paths through the estimation subrange blankers.

The IL estimation subrange blankers 110A/110B are operable to select active_DSA_data within an allocated DSA_subrange (DSA_subrange_allocation). The IL estimation subrange blankers are controlled by an IL estimation subrange allocator 150 that allocates, in successive aggregation cycles, associated DSA_subrange_allocations according to a pre-defined allocation strategy for observed/active DSA setting(s) within observed/allocated DSA setting subrange(s).

The IL mismatch estimator aggregates IL mismatch data based on the active_DSA_data E0/E1 for the allocated DSA_subrange, and generates associated IL mismatch estimates and associated IL mismatch correction parameters 135.

The IL mismatch estimator 130 aggregates IL mismatch estimation data into memory for retrieval in generating IL mismatch estimates and IL mismatch correction parameters. For the DSA subranges, the associated IL mismatch estimation data (statistics) can be aggregated into dedicated memory banks, with each of P DSA setting ranges aggregated to a dedicated aggregation memory bank.

FIG. 4 illustrates an alternate example dual-channel (RX-A/RX-B) IL mismatch estimation engine 200, as in FIG. 3, and configured with an IL mismatch data aggregator 230, and DSA subrange allocation memory 235. As illustrated, the estimation subrange blankers 110A/110B receive RX-A and RX-B IADC data streams, although for the example dual-channel IL mismatch estimation engine, the estimation subrange blankers 110A/110B are configurable for input from either RX-A or RX-B, providing configurable signal paths through the estimation subrange blankers.

For successive DSA_subrange_allocations, the IL mismatch data aggregator aggregates IL mismatch estimation data based on the selected active_DSA_data E0/E1, into dynamically allocable and configurable DSA subrange memory banks in the DSA subrange allocation memory 235.

The IL mismatch estimator 230 retrieves the aggregated IL mismatch data to generate IL mismatch estimates 232 and IL mismatch correction parameters 232/235. For example, IL mismatch estimation data for N FFT bins can be divided into M DSA subrange memories, each of which can aggregate N/M FFT bins for the M DSA setting subranges.

FIG. 5 illustrates an alternate example dual-channel (RX-A/RX-B) IL mismatch estimation engine 300, as in FIG. 4, and with an IL estimation subrange allocator 350 providing additional control for DSA_subrange_allocations. As illustrated, the estimation subrange blankers 110A/110B receive RX-A and RX-B IADC data streams, although for the example dual-channel IL mismatch estimation engine, the estimation subrange blankers 110A/110B are configurable for input from either RX-A or RX-B, providing configurable signal paths through the estimation subrange blankers.

The example IL estimation subrange allocator 350 includes an estimation allocator 351 and DSA subrange allocation controller 353, with the estimation allocator 351 providing a DSA_subrange_allocation_cmd command (based on a pre-defined subrange allocation strategy), and a DSA_subrange_PoorEstim_list, to the DSA subrange allocation controller, which also receives the active_DSA_setting.

For normal allocation operations, in response to the DSA_subrange_allocation-cmd from the estimation allocator 351, the DSA subrange allocation controller 353, the DSA subrange allocation controller issues a DSA_subrange_allocation signal to the estimation subrange blankers 110A/110B.

Based on the DSA_subrange_PoorEstim_list, the DSA subrange allocation controller 353 can initiate a DSA_subrange_forced_allocation routing to override the DSA_subrange_allocation_cmd, and issue a DSA_subrange_allocation signal to the estimation subrange blankers 110A/110B, overriding a DSA_subrange_allocation from the estimation allocator and forcing allocation of DSA subranges that have not been updated frequently enough to provide a pre-defined IL mismatch estimate uncertainty (for example, to satisfy IL mismatch performance requirements).

That is, if a particular DSA range occurs infrequently in such a way that it is not active whenever it is allocated, IL mismatch estimates will become uncertain. The DSA subrange allocation controller effectively operates to force allocation of infrequently allocated DSA subranges. In addition to keeping track of poor-quality channels, the IL estimation subrange allocator 350 maintains a list of poor-quality DSA ranges for each channel. When a DSA setting falls into a poor-quality subrange, for a new aggregation cycle involving a non-poor quality DSA, the DSA subrange allocation controller 353 initiates a DSA_subrange_forced_allocation, clearing the aggregation data for the non-poor quality DSA, and forcing a DSA_subrange_allocation, and IL mismatch data aggregation, for a now-active poor-quality DSA range.

For the example IL mismatch estimation engine, the example IL estimation subrange allocator 350 is implemented with: the estimation allocator 351 implemented in firmware, and the DSA subrange allocation controller 353 implemented in hardware. Normal estimation allocation implemented according to the subrange allocation strategy/algorithm, as implemented in the firmware estimation allocator 351, is a relatively slower control loop than the DSA_subrange_forced_allocation, which operates as a relatively faster control loop.

Figure 6:
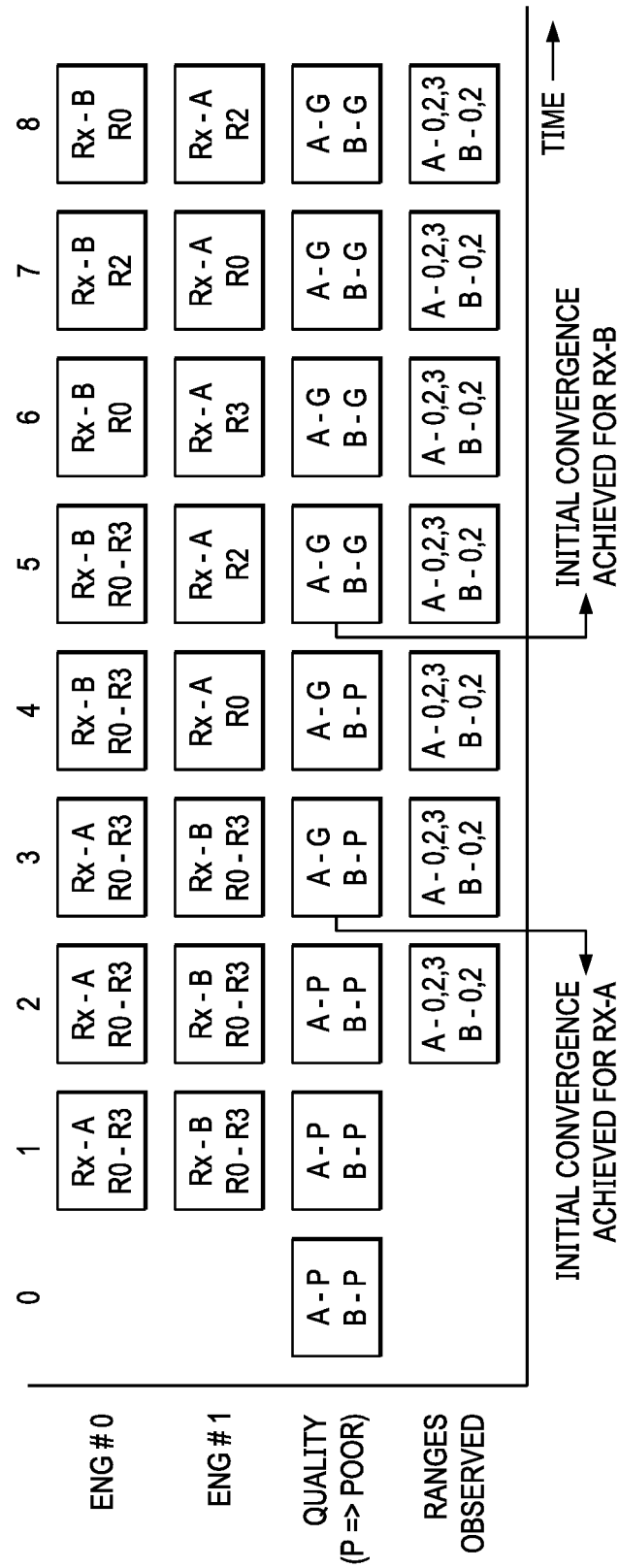
FIG. 6 illustrates an example two phase allocation strategy with an initial-convergence phase and a fine-tuning phase, for an example dual-channel (RX-A and RX-B) IL mismatch estimation engine, and example estimation subrange allocator configured for four DSA subranges (R0-R3): an initial convergence phase in which all DSA subranges are converged to a common IL mismatch estimate for each channel; and a fine-tuning phase in which observed DSA subranges are selectively allocated to reduce IL mismatch estimate uncertainty.

FIG. 6 illustrates an example two phase allocation strategy/algorithm with an initial-convergence phase and an fine-tuning phase, according to aspects of the Disclosure. The example two phase allocation strategy is disclosed for an example dual-channel (RX-A and RX-B) IL mismatch estimation engine, and example estimation subrange allocator configured for four DSA subranges (R0-R3).

The example two phase allocation strategy is based on a pre-defined allocation strategy to selectively allocate active_DSA_data in DSA_subrange_allocations for IL mismatch estimation and IL mismatch correction parameter generation. In the initial convergence phase, for each channel, all DSA subranges are converged to a common IL mismatch estimate. In the fine-tuning phase in which observed DSA subranges are selectively allocated to reduce IL mismatch estimate uncertainty.

FIG. 6 illustrates an example allocation for allocation engines designated E0 and E1, during nine aggregation cycles 0-8. In an initial aggregation cycle 0, both channel A and channel B are of poor quality (P). Beginning in aggregation cycle 1, in the initial-convergence phase, allocation engine E0 allocates channel A across all subranges R0-R3, and allocation engine E1 allocates channel B across all subranges R0-R3. This allocation operation (allocating all subranges R0-R3) continues through aggregation cycles 1-3, when channel A converges to good quality (channel B remains poor quality). Beginning in aggregation cycle 4, channel A shifts to the fine-tuning allocation phase, in which only observed DSA subranges are allocated, and channel B remains in the initial-convergence allocation phase. In aggregation cycle 5, channel B transitions to good quality, so that beginning in aggregation cycle 6, both channels A and B are of good quality, and are allocated in the fine-tuning allocation phase as to observed DSA subranges. Note that, in aggregation cycle 4, allocation engine E0 switches from allocating channel A to channel B, and allocation engine E1 switches from allocating channel B to channel A.

Based on the initial convergence, all DSA subranges are configured to a common (all-DSA-subrange) estimation, which guarantees a moderate initial performance. That is, in the initial convergence phase, all the ranges are allocated together, so that an estimate will be based on all the active DSA subranges. This is common to all the DSA subranges and hence is assigned to all the DSA subranges. Once the uncertainty of this common estimate is lower than a threshold, then that DSA subrange is determined to have got a good estimate.

Once all DSA subranges converge to the common estimation, corresponding to convergence to a good quality estimate, DSA subrange allocation proceeds to the fine-tuning phase. For each channel, allocation is done on a per-DSA range basis. Only the observed/active DSA subranges are allocated (based on the DSA setting statistics/distribution from the statistics collector). This fine-tuning operation ensures tracking performance is optimized for the observed ranges (un-observed ranges are not allocated). As described in connection with the example implementation in FIG. 5, this fine-tuning DSA_subrange_allocation can be overridden to forces allocation of poor-quality, non-observed DSA subranges.

Thus, the example two-phase allocation operates during successive aggregation cycles to initially converge to a moderate 'common' performance across DSA settings for each input channel and/or each DSA subrange. Post initial convergence, DSA_subrange_allocations are fine-tuned for all DSA setting subranges, with each DSA subrange classified as either poor-quality or good-quality, where quality is based on mismatch estimate uncertainty metrics for each channel and each observed DSA subrange (based on DSA setting distribution statistics from the statistics collector). Each observed channel can be allocated, until all such DSA subranges are allocated. Once all observed DSA subranges are allocated, allocation re-starts. Within an allocation strategy, the order of allocation can be randomized. The allocation strategy can also incorporate priority, where the DSA subranges with relatively poorer quality are given higher priority in allocation so that they get more estimates and become better in quality.

Further in the fine tuning phase, if a particular DSA sub-range is not active for some time and its estimate's quality becomes poorer than a certain quality threshold, then the estimate of nearby good quality DSA sub-ranges can be copied to the poor DSA sub-range's estimate so that the actual estimate in the poor DSA sub-range may be better. But if no such nearby good DSA sub-range estimate is available and all DSA sub-ranges of a channel become poor in quality, we may switch back to the initial convergence phase, wherein the HW is commanded to estimate for all the DSA sub-ranges together. In some allocation strategies, this common allocation can be done to certain DSA sub-ranges only. For example, R0 and R1 can be combined if both R0 and R1 are poor but R2 and R3 are good. HW allocation can be then done for R0 and R1 together so that both improve and then later once the estimate uncertainty becomes better than a threshold, they may be assigned independently.

Figure 7A:
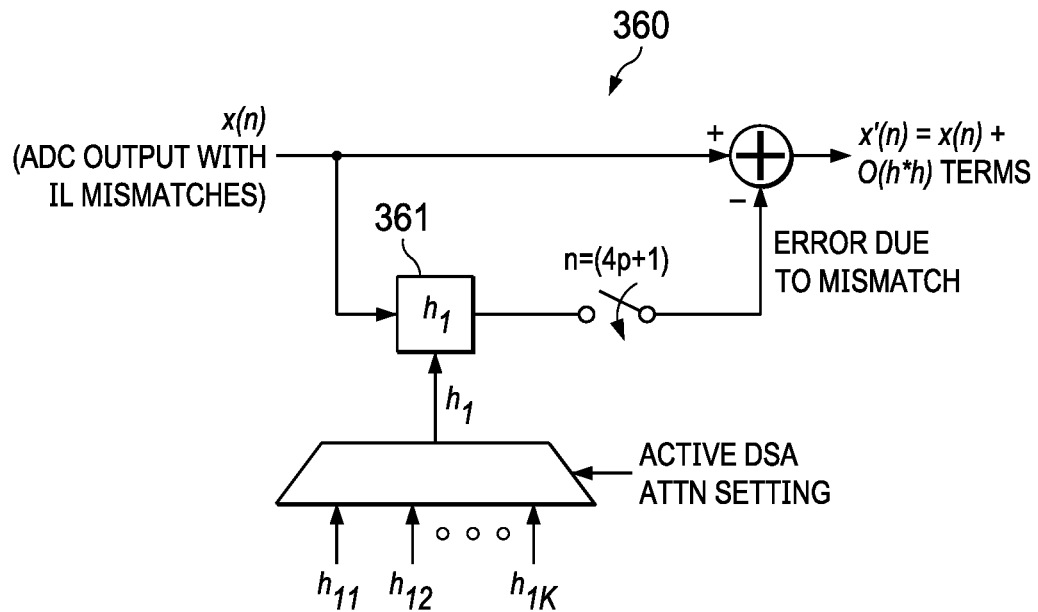
FIGS. 7A and 7B illustrate example IL mismatch correctors controlled by the IL mismatch correction parameters generated by the IL mismatch estimator based on aggregated IL mismatch estimation data derived from the active_DSA_data provided by the IL mismatch estimation engine with DSA_subrange_allocation according to the Disclosure.
Figure 7B:
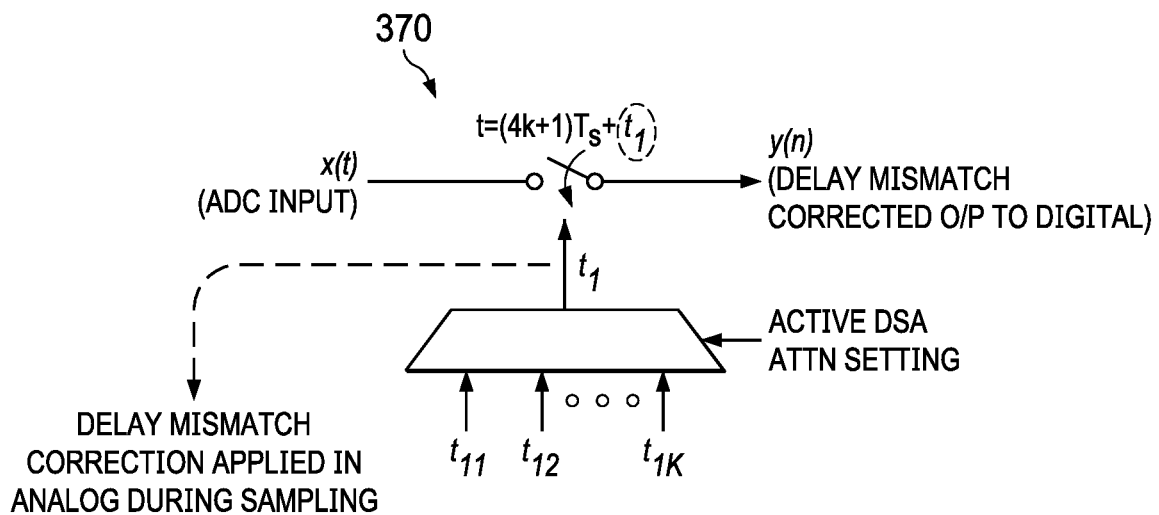

FIGS. 7A and 7B illustrate example IL mismatch correctors controlled by the IL mismatch correction parameters generated by the IL mismatch estimator based on the aggregated IL mismatch estimation data derived from the active_DSA_data within the associated DSA_subrange_allocation:

FIG. 7A illustrates an example digital corrector 360 configured to correct IL gain mismatch dependent on the active DSA setting, using a compensation filter 361 with coefficients based on corresponding IL mismatch gain correction parameters. The example architecture uses a compensation filter with coefficients chosen based on the currently active DSA setting.

FIG. 7B illustrates an example analog corrector configured to correct IL timing mismatch dependent on the active DSA setting, based on estimated IL mismatch timing correction parameters. Timing IL mismatches are corrected in analog. The example architecture uses a structure where the timing correction used by analog is dependent on the currently active DSA setting.

In summary, Estimation of DSA-setting-based IL mismatch within DSA setting subranges for interleaved ADCs according to the Disclosure, includes an IL mismatch estimation engine with selective estimation allocation/blanking for observed DSA setting(s) within allocated DSA setting subrange(s), and with aggregation of corresponding IL mismatch data (statistics) to provide IL mismatch estimates and associated IL mismatch correction parameters. In example implementations, the IL mismatch estimation engine includes an IL estimation subrange blanker to selectively allocated for DSA subrange of DSA settings. An estimation subrange allocator implements an allocation strategy to enable efficient use of the IL mismatch estimation engine, based on a distribution of active DSA settings over a predefined interval from a DSA statistics collector, and IL estimation mismatch uncertainty data from an IL mismatch estimator. For multi-channel configurations, the IL mismatch estimation engine enables configurable aggregation of IL mismatch estimation data for a specific input channel, and a specific DSA-setting subrange. The allocation logic effectively maps an aggregation configuration to an input channel, and blanker logic ensures that for a given aggregation configuration, IL mismatch estimation is active only for the specific programmed range(s) of DSA settings.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit for analog-to-digital conversion (ADC), comprising:
    an RX channel input to receive a RX (receive) signal;
    an interleaved ADC (IADC) to convert the RX signal input through the RX channel and an analog signal path, to interleaved (IL) digital data (IADC data stream) for output through a digital signal path;
    the RX signal attenuated by a digital step attenuator (DSA) based on an active DSA setting, within a range of DSA settings (DSA setting range) corresponding to selectable attenuation steps, the DSA setting range partitioned into a defined number of DSA setting subranges (DSA subranges); and
    an IL mismatch estimation engine in the digital signal path, including:
        an estimation subrange blanker coupled to receive the IADC data stream, and responsive to a DSA subrange allocation signal to select, in each of successive aggregation cycles, IADC data corresponding to an active DSA setting (DSA active data) that is within an allocated DSA subrange (DSA allocated subrange); and
        an IL mismatch estimator:
            to aggregate, during each aggregation cycle, IL mismatch estimation data (aggregated IL mismatch estimation data) based on the selected DSA active data within the DSA allocated subrange,
            to generate an estimate of IL mismatch (IL mismatch estimate) based on the aggregated IL mismatch estimation data, and
            to generate IL mismatch correction parameters based on the aggregated IL mismatch estimation data;
        a DSA statistics collector to collect a distribution of DSA settings over a pre-defined time period (DSA setting distribution statistics); and
        an estimation subrange allocator to generate the DSA subrange allocation signal for input to the estimation subrange blanker based at least in part on the DSA setting distribution statistics.

2. The circuit of claim 1, the IL mismatch estimation engine further including:
    an IL mismatch data aggregator; and
    a DSA subrange memory;
    the IL mismatch data aggregator:
        during each aggregation cycle, to aggregate IL mismatch estimation data based on the selected DSA active data within the DSA allocated subrange into the DSA subrange memory,
        the DSA subrange memory partitioned into corresponding configurable DSA memory banks (DSA allocated subrange memory) within the DSA subrange memory,
        the IL mismatch estimator to generate the IL mismatch estimate based on the aggregated IL mismatch estimation data retrieved from the DSA subrange memory.

3. The circuit of claim 2, wherein:
    the IL mismatch data aggregator includes an FFT module to convert the active DSA data into corresponding FFT blocks of frequency domain data partitioned into frequency bins; and
    the IL mismatch data aggregator generating, for the DSA allocated subrange, the corresponding IL mismatch estimation data based on the frequency domain statistics.

4. The circuit of claim 1, wherein:
    the IL mismatch aggregator is further configured to generate IL mismatch estimate uncertainty data corresponding to an uncertainty in the IL mismatch estimate used to generate the associated IL mismatch correction parameters for the DSA allocated subrange;
    the estimation subrange allocator is further configured to generate the DSA subrange allocation signal based at least in part on the IL mismatch estimate uncertainty data; and
    the estimation subrange allocator is further configured to generate the DSA subrange allocation signal based on an allocation strategy for selecting DSA active data for allocation to the IL mismatch estimator, the allocation strategy comprising:
        an initial convergence phase in which all DSA subranges are allocated to the IL mismatch estimator until the IL mismatch estimate for each DSA subrange corresponds to a common IL mismatch estimate based on the corresponding IL mismatch uncertainty data; and then
        an estimation fine-tuning phase in which the DSA subranges are allocated for IL mismatch estimation according to a defined allocation strategy based on the IL mismatch uncertainty data.

5. The circuit of claim 4, wherein the estimation subrange allocator's allocation strategy is determined by a quality of the IL mismatch estimate for each active DSA sub-range, and wherein
    if all of the active DSA sub-ranges have poor quality mismatch estimates, then the estimation sub-range allocator moves to an initial convergence phase; and
    if all of the active DSA sub-ranges have good quality mismatch estimates, then the estimation sub-range allocator moves to an estimation fine-tuning phase; and
    if some active DSA sub-ranges have poor quality mismatch estimates and other active DSA sub-ranges have good quality mismatch estimates, then the estimation sub-range allocator gives higher priority of allocation to the active DSA sub-ranges with poor quality mismatch estimates.

6. The circuit of claim 1, wherein:
    the DSA statistics collector and the estimation subrange blanker comprise signal chain hardware blocks; and
    the estimation subrange allocator comprises firmware executed by a controller.

7. The circuit of claim 1, further comprising:
    an analog corrector configured to correct IL timing mismatch dependent on the active DSA setting based on estimated IL timing mismatch correction parameters generated, for the active DSA setting, by the IL mismatch estimator; and
    a digital corrector configured to correct IL gain mismatch dependent on the active DSA setting using a compensation filter with coefficients based on estimated IL gain mismatch correction parameters generated, for the active DSA setting, by the IL mismatch estimator.

8. The circuit of claim 1, further comprising:
multiple input RX channels to receive multiple RX signals, successively converted by the interleaved ADC to the corresponding IADC data stream.

9. The circuit of claim 1, wherein:
the interleaved ADC is an interleaved RF ADC used in a system for RF communication; and
the RX signal is an RF RX signal.

10. The circuit of claim 1, wherein:
the DSA is integrated into the analog signal path, coupled to receive the RX signal through the input RX channel, and to provide the attenuated RX signal to an input of the interleaved ADC.

11. A DSA circuit for digital step attenuation (DSA), for use with an interleaved (IL) analog-to-digital converter (IADC) circuit configured to convert a receive (RX) signal input through an RX channel and an analog signal path, to interleaved digital data (IADC data stream) for output through a digital signal path, the DSA circuit comprising:
the RX signal attenuated by the DSA circuit based on an active DSA setting, within a range of DSA settings (DSA setting range) corresponding to selectable attenuation steps, the DSA setting range partitioned into a defined number of DSA setting subranges (DSA subranges); and
an IL mismatch estimation engine in the digital signal path, including:
an estimation subrange blanker coupled to receive the IADC data stream, and responsive to a DSA subrange allocation signal to select, in each of successive aggregation cycles, IADC data corresponding to an active DSA setting (DSA active data) that is within an allocated DSA subrange (DSA allocated subrange); and
an IL mismatch estimator:
to aggregate, during each aggregation cycle, IL mismatch estimation data (aggregated IL mismatch estimation data) based on the selected DSA active data within the DSA allocated subrange, and
to generate an estimate of IL mismatch (IL mismatch estimate) based on the aggregated IL mismatch estimation data, and
to generate IL mismatch correction parameters based on the aggregated IL mismatch estimation data;
a DSA statistics collector to collect a distribution of DSA settings over a pre-defined time period (DSA setting distribution statistics); and
an estimation subrange allocator to generate the DSA subrange allocation signal for input to the estimation subrangte blanker based at least in part on the DSA setting distribution statistics.

12. The DSA circuit of claim 11, the IL mismatch estimation engine further including:
an IL mismatch data aggregator; and
a DSA subrange memory;
the IL mismatch data aggregator:
during each aggregation cycle, to aggregate IL mismatch estimation data based on the selected DSA active data within the DSA allocated subrange into the DSA subrange memory,
the DSA subrange memory partitioned into corresponding configurable DSA memory banks (DSA allocated subrange memory) within the DSA subrange memory,
the IL mismatch estimator to generate the IL mismatch estimate based on the aggregated IL mismatch estimation data retrieved from the DSA subrange memory.

13. The DSA circuit of claim 12, wherein:
the IL mismatch data aggregator includes an FFT module to convert the active DSA data into corresponding FFT blocks of frequency domain data partitioned into frequency bins; and
the IL mismatch data aggregator generating, for the DSA allocated subrange, the corresponding IL mismatch estimation data based on the frequency domain statistics.

14. The DSA circuit of claim 11, wherein:
the IL mismatch aggregator is further configured to generate IL mismatch estimate uncertainty data corresponding to an uncertainty in the IL mismatch estimate used to generate the associated IL mismatch correction parameters for the DSA allocated subrange;
the estimation subrange allocator is further configured to generate the DSA subrange allocation signal based at least in part on the IL mismatch estimate uncertainty data; and
the estimation subrange allocator generates the DSA subrange allocation signal based on an allocation strategy for selecting DSA active data for allocation to the IL mismatch estimator, the allocation strategy comprising:
an initial convergence phase in which all DSA subranges are allocated to the IL mismatch estimator until the IL mismatch estimate for each DSA subrange corresponds to a common IL mismatch estimate based on the corresponding IL mismatch uncertainty data; and then
an estimation fine-tuning phase in which the DSA subranges are allocated for IL mismatch estimation according to a defined allocation strategy based on the IL mismatch uncertainty data.

15. The DSA circuit of claim 14, wherein the estimation subrange allocator's allocation strategy is determined by a quality of the IL mismatch estimate for each active DSA sub-range, and wherein
if all of the active DSA sub-ranges have poor quality mismatch estimates, then the estimation sub-range allocator moves to an initial convergence phase; and
if all of the active DSA sub-ranges have good quality mismatch estimates, then the estimation sub-range allocator moves to an estimation fine-tuning phase; and
if some active DSA sub-ranges have poor quality mismatch estimates and other active DSA sub-ranges have good quality mismatch estimates, then the estimation sub-range allocator gives higher priority of allocation to the active DSA sub-ranges with poor quality mismatch estimates.

16. The DSA circuit of claim 11, wherein:
the DSA statistics collector and the estimation subrange blanker comprise signal chain hardware blocks; and
the estimation subrange allocator comprises firmware executed by a controller.

17. The DSA circuit of claim 11, further comprising:
an analog corrector configured to correct IL timing mismatch dependent on the active DSA setting based on estimated IL timing mismatch correction parameters generated, for the active DSA setting, by the IL mismatch estimator; and
a digital corrector configured to correct IL gain mismatch dependent on the active DSA setting using a compensation filter with coefficients based on estimated IL gain mismatch correction parameters generated, for the active DSA setting, by the IL mismatch estimator.

18. The DSA circuit of claim 11, wherein:
the interleaved ADC is an interleaved RF ADC used in a system for RF communication; and
the RX signal is an RF RX signal.

19. The DSA circuit of claim 11, wherein the DSA circuit is integrated with the IADC circuit.

20. A method for digital step attenuation (DSA), for use with an interleaved (IL) analog-to-digital converter (IADC) circuit configured to convert a receive (RX) signal input through an RX channel and an analog signal path, to interleaved digital data (IADC data stream) for output through a digital signal path, the method operable to attenuate the RX signal based on an active DSA setting, within a range of DSA settings (DSA setting range) corresponding to selectable attenuation steps, the DSA setting range partitioned into a defined number of DSA setting subranges (DSA subranges), the method comprising:
selecting, in response to a DSA subrange allocation signal, in each of successive aggregation cycles, IADC data corresponding to an active DSA setting (DSA active data) that is within an allocated DSA subrange (DSA allocated subrange); and
performing IL mismatch estimation based on:
aggregating, during each aggregation cycle, IL mismatch estimation data (aggregated IL mismatch estimation data) based on the selected DSA active data within the DSA allocated subrange,
generating generate an estimate of IL mismatch (IL mismatch estimate) based on the aggregated IL mismatch estimation data, and
generating IL mismatch correction parameters based on the aggregated IL mismatch estimation data;
collecting a distribution of DSA settings over a predefined time period (DSA setting distribution statistics); and
generating the DSA subrange allocation signal based at least in part on the DSA setting distribution statistics.

21. The method of claim 20, wherein performing IL mismatch estimation is accomplished by:
during each aggregation cycle, aggregating IL mismatch estimation data based on the selected DSA active data within the DSA allocated subrange into a DSA subrange memory,
the DSA subrange memory partitioned into corresponding configurable DSA memory banks (DSA allocated subrange memory) within the DSA subrange memory,
the IL mismatch estimate generated based on the aggregated IL mismatch estimation data retrieved from the DSA subrange memory.

22. The method of claim 21, wherein:
the IL mismatch estimation data is aggregated by converting the active DSA data into corresponding FFT blocks of frequency domain data partitioned into frequency bins; and
the corresponding IL mismatch estimation data is generated, for the DSA allocated subrange, based on the frequency domain statistics.

23. The method of claim 20, further comprising:
generating IL mismatch estimate uncertainty data corresponding to an uncertainty in the IL mismatch estimate used to generate the associated IL mismatch correction parameters for the DSA allocated subrange;
generating the DSA subrange allocation signal based at least in part on the DSA setting distribution statistics and the IL mismatch estimate uncertainty data;
generating the DSA subrange allocation signal based on an allocation strategy for selecting DSA active data for allocation to the IL mismatch estimator, the allocation strategy comprising:
an initial convergence phase in which all DSA subranges are allocated until the IL mismatch estimate for each DSA subrange corresponds to a common IL mismatch estimate based on the corresponding IL mismatch uncertainty data; and then
an estimation fine-tuning phase in which the DSA subranges are allocated for IL mismatch estimation according to a defined allocation strategy based on the IL mismatch uncertainty data.

24. The method of claim 23, wherein the allocation strategy is determined by a quality of the IL mismatch estimate for each active DSA sub-range, and wherein
if all of the active DSA sub-ranges have poor quality mismatch estimates, then the allocation strategy operates in an initial convergence phase; and
if all of the active DSA sub-ranges have good quality mismatch estimates, then the allocation strategy operates in an estimation fine-tuning phase; and
if some active DSA sub-ranges have poor quality mismatch estimates and other active DSA sub-ranges have good quality mismatch estimates, then the allocation strategy operates to give higher priority of allocation to the active DSA sub-ranges with poor quality mismatch estimates.

25. The method of claim 20, further comprising:
correcting, in the analog signal path, IL timing mismatch dependent on the active DSA setting based on estimated IL timing mismatch correction parameters generated for the active DSA setting; and
correcting, in the digital signal path, IL gain mismatch dependent on the active DSA setting using a compensation filter with coefficients based on estimated IL gain mismatch correction parameters generated for the active DSA setting.

26. The method of claim 20, wherein:
the interleaved ADC is an interleaved RF ADC used in a system for RF communication; and
the RX signal is an RF RX signal.

* * * * *